United States Patent [19]

Ibuchi et al.

[11] Patent Number: 4,998,130
[45] Date of Patent: Mar. 5, 1991

[54] METHOD OF LOADING MEDIA SHEET

[75] Inventors: Yoshiaki Ibuchi; Mitsuru Ogura, both of Nara, Japan

[73] Assignee: Sharp Kabushiki Kaisha, Osaka, Japan

[21] Appl. No.: 490,067

[22] Filed: Mar. 7, 1990

[30] Foreign Application Priority Data

| Mar. 7, 1989 | [JP] | Japan | 1-54548 |
| Mar. 7, 1989 | [JP] | Japan | 1-25615[U] |
| Mar. 7, 1989 | [JP] | Japan | 1-25620[U] |

[51] Int. Cl.$^5$ .................. G03B 27/32; G03B 27/52
[52] U.S. Cl. ..................... 355/27; 354/301; 355/77
[58] Field of Search ............ 355/27, 72, 77; 430/138; 354/297–304

[56] References Cited

U.S. PATENT DOCUMENTS

| 4,868,919 | 9/1989 | Tanaka et al. | 355/27 |
| 4,918,482 | 4/1990 | Ogura | 355/27 |
| 4,920,375 | 4/1990 | Akao et al. | 355/27 |
| 4,941,014 | 7/1990 | Ogura | 355/27 |
| 4,952,968 | 8/1990 | Ibuchi | 355/27 |

FOREIGN PATENT DOCUMENTS 58-88739  5/1983  Japan.

Primary Examiner—Richard A. Wintercorn

[57] ABSTRACT

A method of loading a media sheet, in which after a rolled media sheet coated with photo-setting microcapsules has been mounted on a supply portion, a front end portion of the media sheet is taken up by a take-up shaft from the supply portion through a pair of pressure rollers, comprising the steps of: taking up the front end portion of the media sheet by the take-up shaft; cancelling a pressing force of the pressure rollers such that a predetermined amount of the media sheet is further taken up by the take-up shaft; and recovering the pressing force of the pressure rollers.

4 Claims, 18 Drawing Sheets

METHOD OF LOADING MEDIA SHEET

BACKGROUND OF THE INVENTION

The present invention generally relates to an image forming apparatus employing a media sheet coated with photo-setting microcapsules and more particularly, to a method of loading the media sheet, in which a front end portion of the newly mounted media sheet of a rolled form is drawn up to a predetermined position.

Japanese Patent Laid-Open Publication No. 58-88739 laid open for public inspection on May 26, 1983 discloses an image forming method which employs a media sheet coated, on its surface, with photo-setting microcapsules (hereinbelow, referred simply to as "microcapsules") containing photo-setting material and colorless dye and an image receiving sheet coated with developing material causing a color development reaction with the colorless dye of the microcapsules. In this known image forming method, after the media sheet has been subjected to exposure by an image of an original document, the media sheet and the image receiving sheet are pressed against each other. The microcapsules are set at a portion of a surface of the media sheet, which portion has received light of exposure of the image of the original document and thus, a selectively set image is formed on the surface of the media sheet. When the media sheet is placed on the image receiving sheet so as to be pressed against the image receiving sheet, the unset microcapsules of the media sheet are ruptured, so that the colorless dye contained in the microcapsules oozes out of the microcapsules. This colorless dye causes a color development reaction with the developing material on the image receiving sheet and thus, an image can be obtained on the image receiving sheet.

The media sheet employed in the known image forming method is wound in a rolled form such that the surface having the microcapsules coated thereon faces inwardly for the purpose of preventing such phenomena that the microcapsules are ruptured by external forces before an image forming operation and that the microcapsules are set by external light. Meanwhile, the media sheet wound in a rolled form is provided as a cartridge such that the media sheet can be easily mounted on a supply portion of an image forming apparatus. The media sheet mounted on the supply portion is introduced by a plurality of rollers into a transport passage having an exposure position and a pressing position. The media sheet having passed through the pressing position is taken up by a take-up shaft.

However, the media sheet has a thickness of as small as about 25 μm and pressure rollers at the pressing position are pressed against each other at a linear pressure of 80–90 kg/cm so as to rupture the microcapsules. Therefore, in the case where a loading operation of the media sheet, in which a front end portion of the media sheet mounted on the supply portion is drawn out of the cartridge and is taken up by the take-up shaft through the transport passage, is performed manually, the loading operation is quite troublesome. Meanwhile, if an error in position for mounting the front end portion of the media sheet on the take-up shaft is produced at the time of the loading operation, such inconveniences are incurred during subsequent use that the media sheet are fed obliquely and wrinkles are produced on the pressure rollers Thus, the present inventor previously proposed a loading method in which when a door of the image forming apparatus has been closed after the front end portion of the media sheet mounted on the supply portion was drawn up to a predetermined position by the operator, rollers and the pressure rollers at the transport passage are rotated together with the take-up shaft such that the front end portion of the media sheet is automatically taken up by the take-up shaft.

However, in manufacturing processes of the prior art image forming apparatus, there is slight difference in tolerance of parallel between the take-up shaft and the pressure rollers. Therefore, when the media sheet wound in a rolled form is transported continuously for a long term, the above slight difference accumulates so as to produce a large nonuniformity in position of the media sheet in an axial direction of the rollers. As a result, such problems arise that a side edge of the media sheet is brought into contact with a guide and a portion of an image of an original document is not exposed onto the media sheet at the time of exposure of the media sheet, thereby resulting in partial formation of the image of the original document.

SUMMARY OF THE INVENTION

Accordingly, an essential object of the present invention is to provide a method of loading a media sheet, in which after a front end portion of the media sheet has been taken up by a take-up shaft, a predetermined amount of the media sheet is taken up by the take-up shaft in a state where a pressing force of pressure rollers is cancelled. By using this method, it becomes possible to eliminate error of position of the media sheet in a transport direction of the media sheet due to mounting error between the take-up shaft and the pressure rollers and the media sheet can be properly transported for a long term.

Furthermore, another important object of the present invention is to provide a method of loading the media sheet, in which after the media sheet has been taken up by the take-up shaft, the media sheet disposed adjacent to the pressure rollers is subjected to exposure and then, the pressing force of the pressure rollers is recovered. By using this method, such a phenomenon can be preliminarily prevented that at the time of recovery of the pressing force of the pressure rollers, microcapsules of the media sheet are ruptured and thus, colorless dye oozes out of the microcapsules.

In order to accomplish these objects of the present invention, there is provided a method of loading a media sheet, according to the present invention, in which after a rolled media sheet coated with photo-setting microcapsules has been mounted on a supply portion, a front end portion of the media sheet is taken up by a take-up shaft from the supply portion through a pair of pressure rollers, comprising the steps of: taking up the front end portion of the media sheet by the take-up shaft; cancelling a pressing force of the pressure rollers such that a predetermined amount of the media sheet is further taken up by the take-up shaft; and recovering the pressing force of the pressure rollers.

Furthermore, in the method of the present invention, before the pressing force of the pressure rollers is recovered, the media sheet disposed in the vicinity of the pressure rollers is subjected to exposure for a predetermined period.

In accordance with the present invention, since the predetermined amount of the media sheet is taken up by the take-up shaft in a state where the pressing force of the pressure rollers is not applied to the media sheet, take-up of the media sheet by the take-up shaft does not contain mounting error between the pressure rollers and the take-up shaft.

Furthermore, in accordance with the present invention, after the microcapsules of the media sheet disposed in the vicinity of the pressure rollers have been set, the pressing force of the pressure rollers is recovered Therefore, such an inconvenience is not incurred that the microcapsules are ruptured through recovery of the pressing force of the pressure rollers.

BRIEF DESCRIPTION OF THE DRAWINGS

These objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
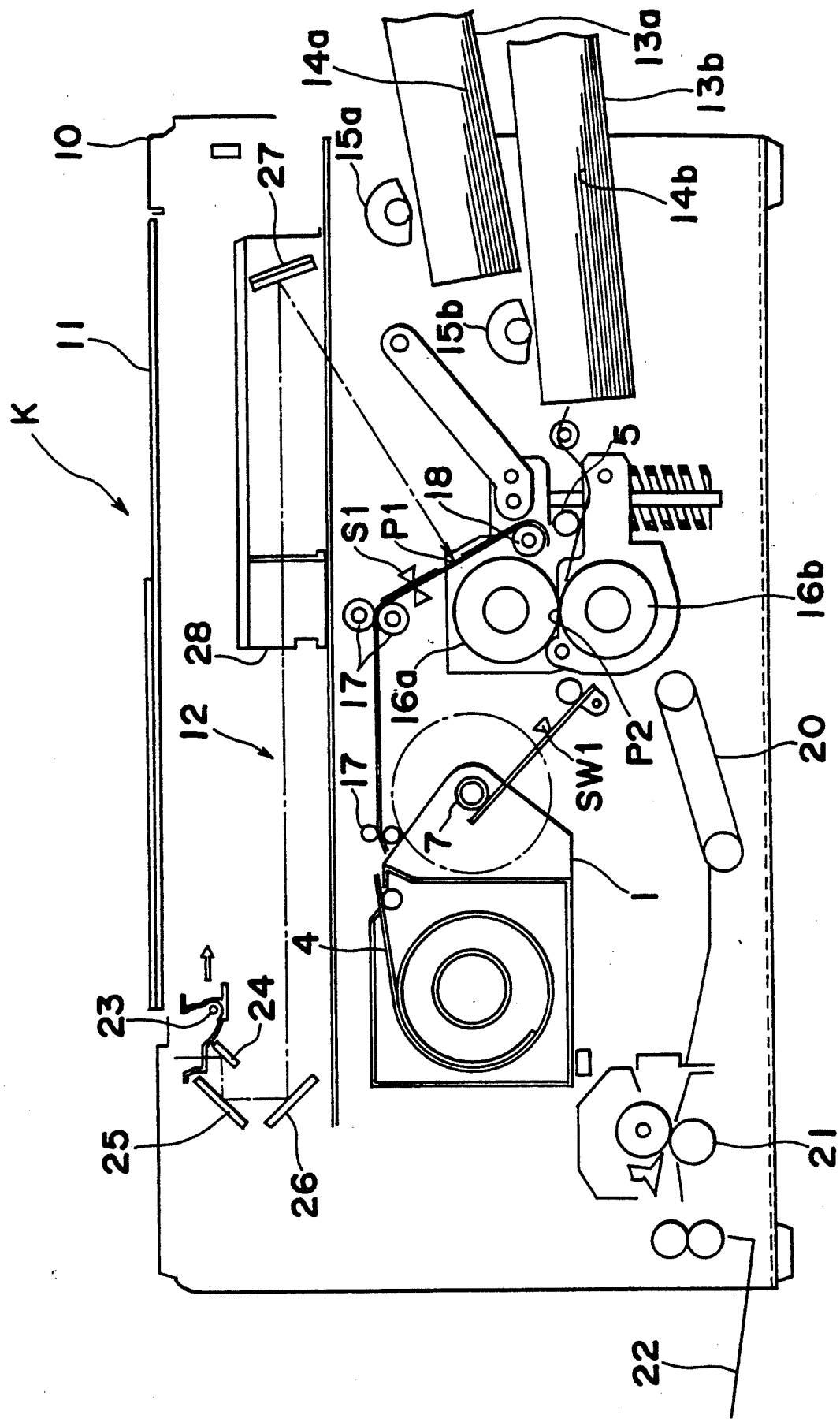
FIG. 1 is a schematic sectional view of an image forming apparatus to which a method of loading a media sheet, according to the present invention may be applied.

Referring now to the drawings, there is shown in FIG. 1, an image forming apparatus K to which a method of loading a media sheet 4, according to the present invention may be applied. The apparatus K has an apparatus housing 10 in which a cartridge 1 containing the media sheet 4 is mounted. The media sheet 4 is guided, through an exposure position P1, to a pressing position P2 by rollers 17 and a leader sprocket 18. At the pressing position P2, pressure rollers 16a and 16b are pressed against each other. The media sheet 4 having passed through the pressing position P2 is taken up by a take-up shaft 7. A cassette 13a containing a plurality of image receiving sheets 14a and a cassette 13b containing a plurality of image receiving sheets 14b are mounted in one side of the apparatus housing 10 such that the image receiving sheets 14a and 14b confront paper feeding rollers 15a and 15b, respectively. Upon rotation of the paper feeding rollers 15a and 15b, the image receiving sheets 14a or 14b are transported to the pressing position P2 one sheet at a time.

An original platform 11 made of hard transparent glass is provided at an upper face of the apparatus housing 10. An optical system 12, which is constituted by a light source 23, mirrors 24 to 27 and a lens 28, is provided below the original platform 11. In the optical system 12, the light source 23 and the mirrors 24 to 26 are reciprocated below the original platform 10 so as to scan an image of an original document placed on the original platform 11. By this scanning, light of the light source 23 reflected from the image of the original document is directed to the exposure position P1 by way of the mirrors 24 to 27 and the lens 28. At a left side of the pressure rollers 16a and 16b, a transport belt 20 and heat rollers 21 are provided so as to form a discharge passage of the image receiving sheets 14a and 14b leading to a discharge tray 22.

In the apparatus K of the above described arrangement, the media sheet 4 is subjected to exposure of the image of the original document at the exposure position P1 such that a selectively set image is formed on a surface of the media sheet 4. The media sheet 4 and the image receiving sheet 14a or 14b are pressed against each other by the pressure rollers at the pressing position P2 such that unset microcapsules of the media sheet 4 are ruptured. The used media sheet 4 having passed through the pressing position P2 is taken up by the take-up shaft 7. On the other hand, the image receiving sheet 14a or 14b having an image formed thereon by a color development reaction between colorless dye and developing material is guided to the heat rollers 21 by the transport belt 20. Thermoplastic is coated on a surface of each of the image receiving sheets 14a and 14b together with the developing material and is fused by heat of the heat rollers 21 so at to impart gloss to the surface of the image of the image receiving sheet 14a or 14b.

Figure 2:
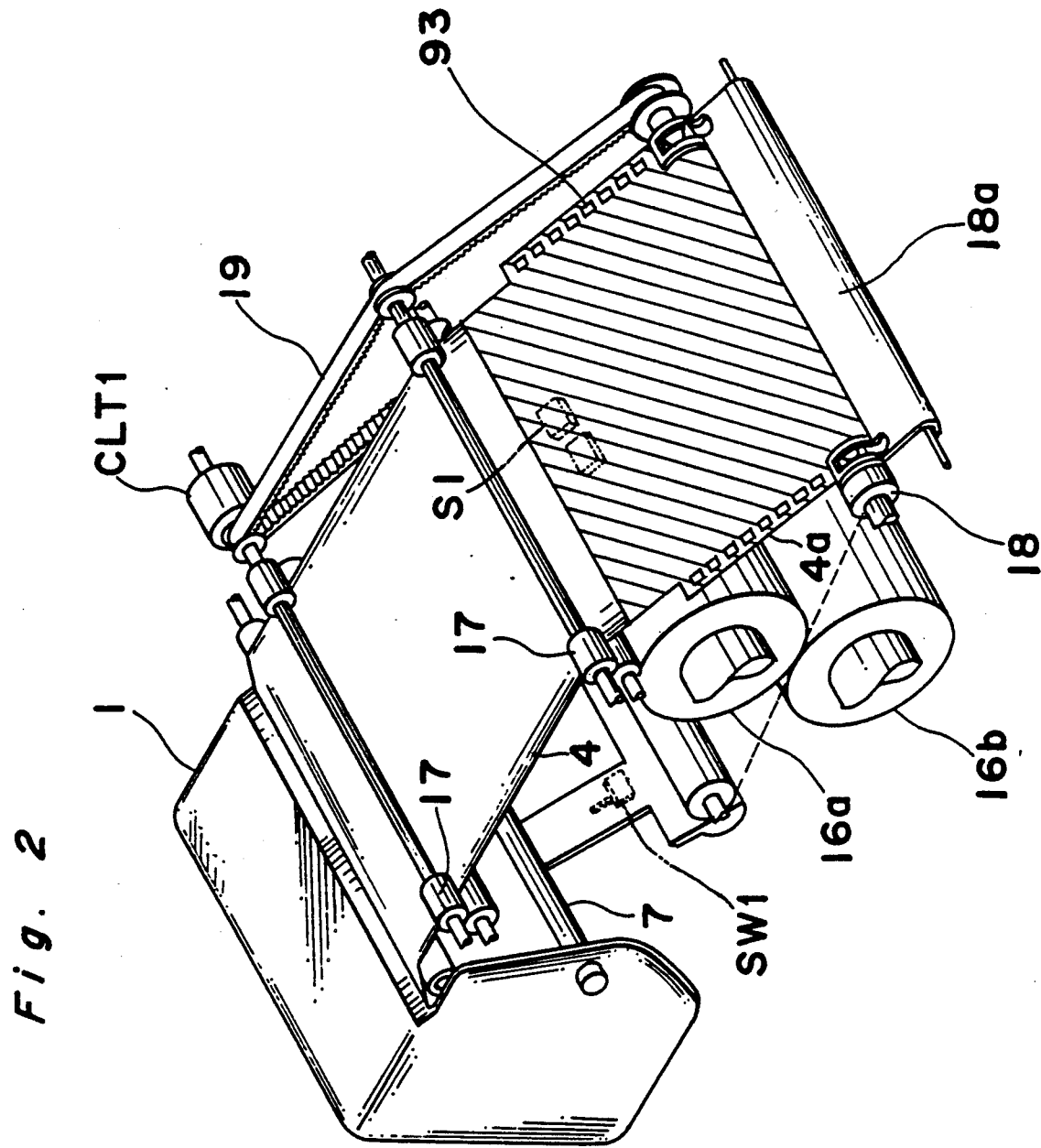
FIG. 2 is a fragmentary perspective view of the image forming apparatus of FIG. 1, showing a transport passage of the media sheet.

FIG. 2 shows a transport passage of the media sheet 4 in the apparatus K. The media sheet 4 accommodated in the cartridge 1 is taken up by the take-up shaft 7 via the pressure rollers 16a and 16b by the rollers 17 and the leader sprocket 18. A leader portion 4a is bonded to a front end portion of the media sheet 4 such that teeth of the leader sprocket 18 are fitted into sprocket holes 93 formed at opposite side portions of the leader portion 4a. Rotation of a main motor M1 (FIG. 4) is transmitted to the rollers 17 and the leader sprocket 18 through a clutch CLT1 by a cogged belt 19 and is also transmitted to the pressure roller 16a and the take-up roller 7. Between the rollers 17 and the leader sprocket 18, a pair of sensors S1 confronting each other are provided so as to interpose the media sheet 4 therebetween. Meanwhile, a switch SW1 is provided between the pressure rollers 16a and 16b and the take-up shaft 7. The sensors S1 and the switch SW1 are provided for detecting passage and arrival of the media sheet 4.

Figure 3:
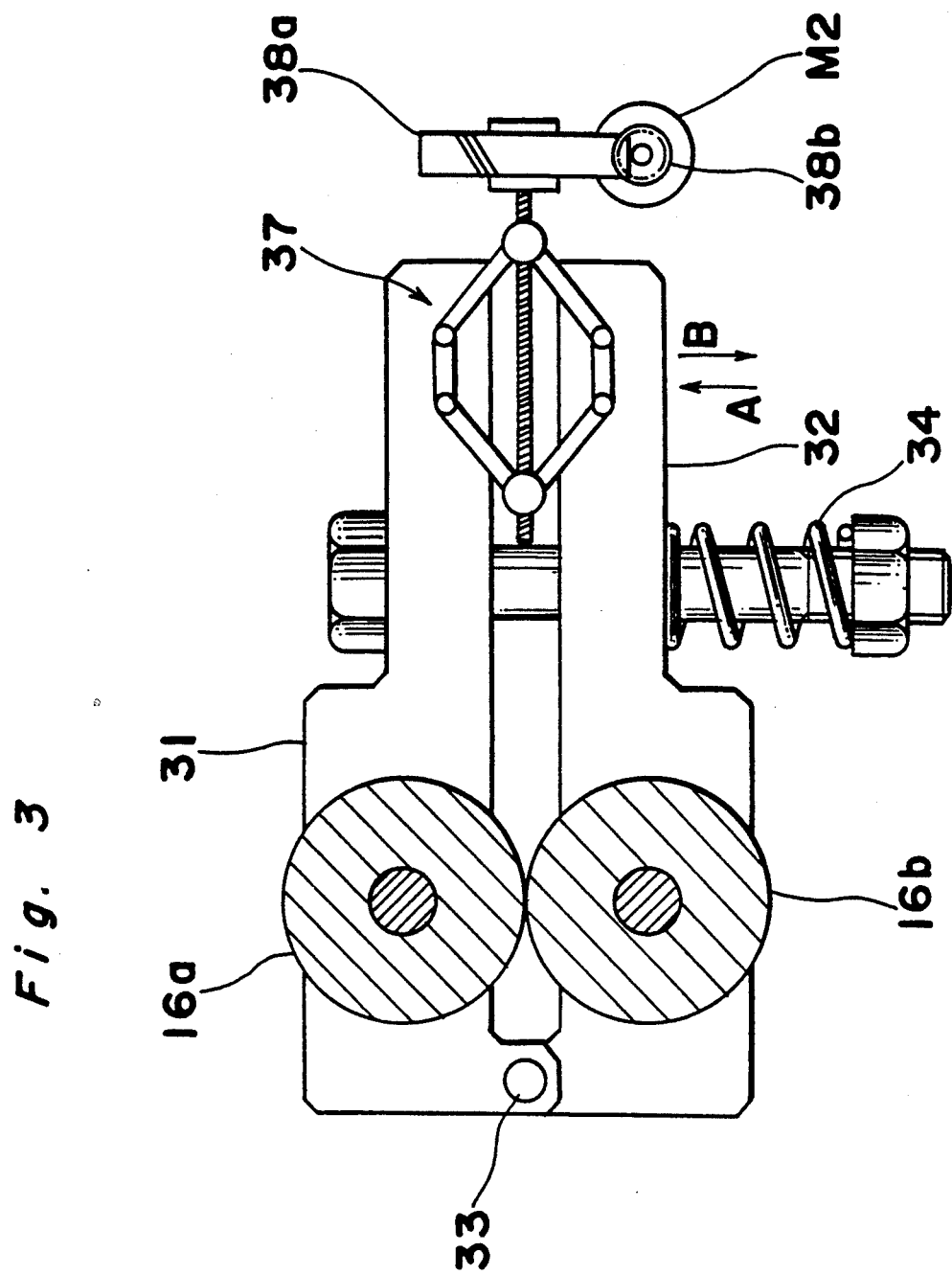
FIG. 3 is a view of a pressing mechanism of pressure rollers employed in the image forming apparatus of FIG. 1.

FIG. 3 shows a pressing mechanism of the pressure rollers 16a and 16b employed in the apparatus K. The pressure rollers 16a and 16b are supported by upper and lower frames 31 and 32, respectively. The upper frame 31 is secured to the apparatus housing 10, while the lower frame 32 is rotatably provided so as to be rotated about a fulcrum 33 relative to the upper frame 31. An elastic force of a spring 34 is applied to the lower frame 32 so as to bring the pressure rollers 16a and 16b into pressing contact with each other at a predetermined pressing force. A lift mechanism 37 formed by a link mechanism is provided between the upper and lower frames 31 and 32. Rotation of a motor M2 for cancelling the pressing force of the pressure rollers 16a and 16b is transmitted to the lift mechanism 37 via a worm 38b and a worm wheel 38a. When the motor M2 is rotated forwardly, distance between upper and lower links of the lift mechanism 37 is reduced, so that the lower frame 32 is displaced in the direction of the arrow A by the elastic force of the spring 34. On the contrary, when the motor M2 is rotated in reverse distance between the upper and lower links of the lift mechanism 37 is increased and thus, the lower frame 32 is displaced in the direction of the arrow B against the elastic force of the spring 34.

Figure 4:
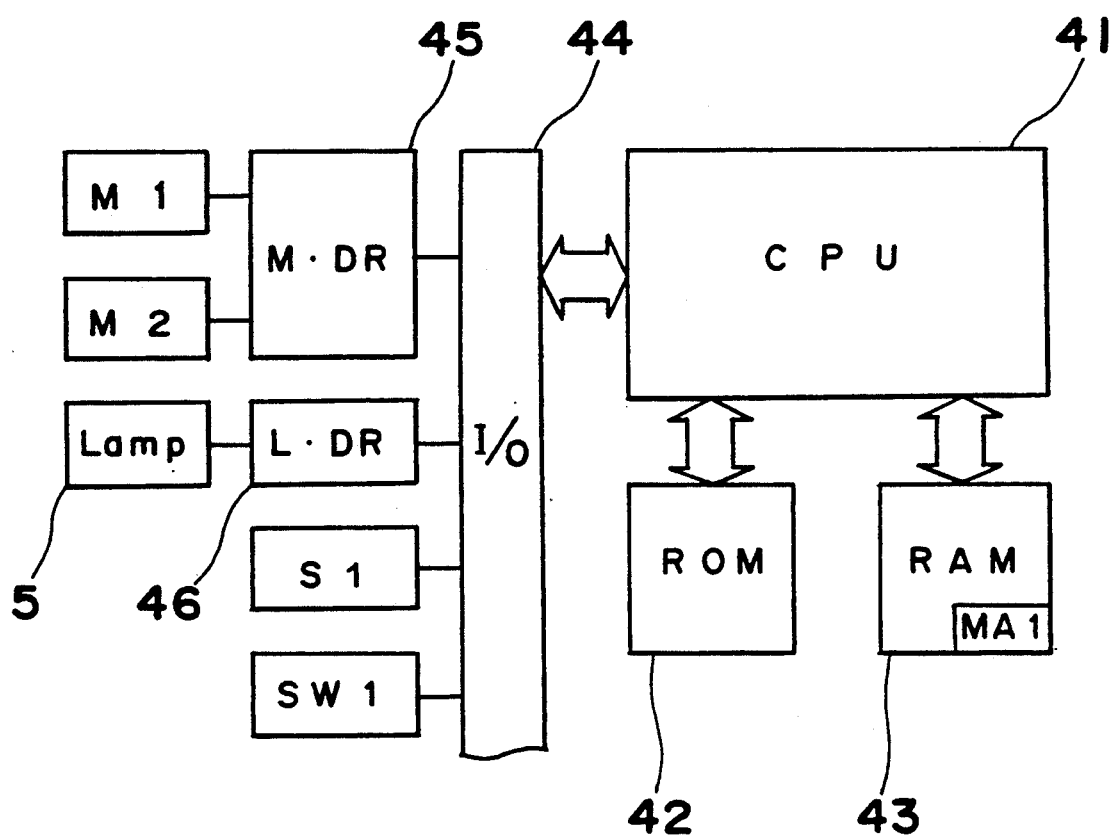
FIG. 4 is a block diagram showing a control portion of the image forming apparatus of FIG. 1.

FIG. 4 shows a control portion of the apparatus K. The control portion includes a CPU 41. The detection data of the sensors S1 and the switch SW1 are inputted to the CPU 41 through an I/O interface 44. The CPU 41 outputs control data to a motor driver 45 and a lamp driver 46 in accordance with a program stored preliminarily in a ROM 42. On the basis of the control data from the CPU 41, the motor driver 45 drives the main motor M1 and the motor M2 and the lamp driver 46 turns on a non-image forming exposure lamp 5. Meanwhile, a memory area MA1 of a RAM 43 connected to the CPU 41 is allotted to a timer T to be described later.

Figure 5A:
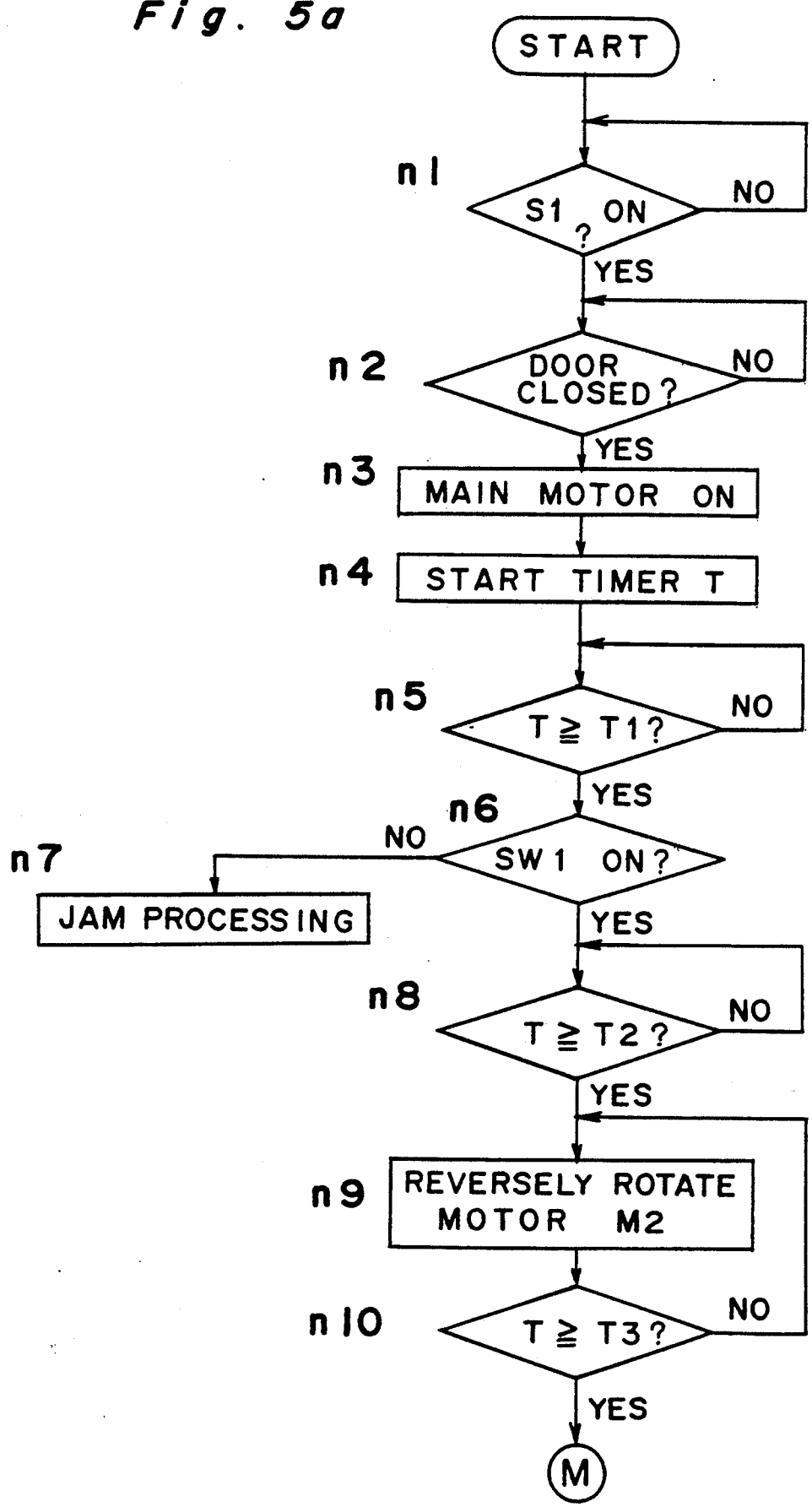
FIGS. 5a and 5b are flow charts showing processing sequences of the control portion of FIG. 4.
Figure 5B:
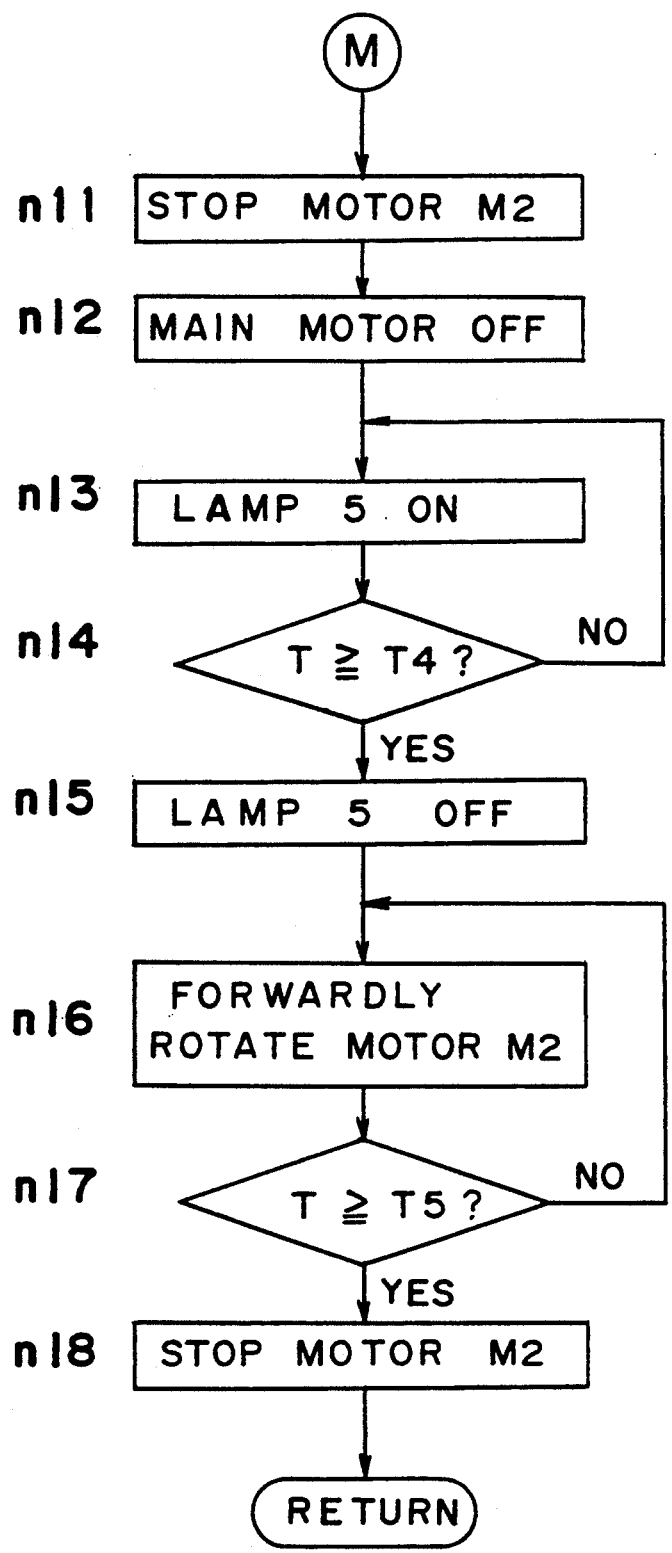

FIGS. 5a and 5b show processing sequences of the control portion of FIG. 4 in a loading mode. When a new cartridge 1 is mounted in the apparatus housing 10 and the leader portion 4a of the media sheet 4 is drawn from the cassette 1 to the location confronting the sensors S1 by an operator and then, a door of the apparatus K is closed, the main motor M1 is turned on and the timer T is started at steps n1 to n4. When the timer T has counted a predetermined period T1 at step n5, it is decided at step n6 whether or not the switch SW1 is in the ON state. In the case of "NO" at step n6, a processing for eliminating jamming of the media sheet 4, for example, stop of the main motor M1, warning display of jamming of the media sheet 4, etc. is performed at step n7. The period T1 is so set as to be long enough to allow the media sheet 4 to reach the switch SW1 from the sensors S1 through the pressure rollers 16a and 16b after start of the main motor M1. Therefore, if the switch SW1 does not detect the media sheet 4 after lapse of the period T1, it is judged that jamming of the media sheet 4 takes place between the sensors S1 and the switch S1.

On the other hand, in the case of "YES" at step n6, rotation of the main motor M1 is continued. If it is found at step n8 that the timer T has counted a period T2, the motor M2 is rotated in reverse for a predetermined period of (T3−T2) at steps n8 to n11. Upon reverse rotation of the motor M2, the lift mechanism 37 shown in FIG. 3 displaces the lower frame 32 in the direction of the arrow B so as to cancel the pressing force of the pressure rollers 16a and 16b. At this time, the main motor M1 is being rotated and thus, the media sheet 4 is taken up by the take-up shaft 7 without being pressed by the pressure rollers 16a and 16b. Meanwhile, the period T2 is a period during which the front end portion of the media sheets 4 is taken up by the take-up shaft 7 a predetermined number of turns.

If it is found at step n10 that the timer T has counted the period T3, the motor M2 and the main motor M1 are stopped at steps n11 and n12. Subsequently, the non-image nonforming exposure lamp 5 is turned on until the timer T counts a period T4 at steps n13 to n15. This period of (T4−T3) is a period during which the microcapsules coated on the media sheet 4 are completely set by the non-image forming exposure lamp 5. If it is found at step n14 that the timer T has counted the period T4, the non-image forming exposure lamp 5 is turned off at step n15 and the motor M2 is forwardly rotated until the timer T counts a period T5 at steps n16 to n18. This period of (T5−T4) is equal to the above mentioned period of (T3−T2) and distance between the upper and lower links of the lift mechanism 37 is returned to a state assumed prior to reverse rotation of the motor M2. Thus, the lower frame 32 is urged in the direction of the arrow A by the elastic force of the spring 34 such that the pressure rollers 16a and 16b are pressed against each other at a predetermined pressing force As described above, in this embodiment, when the front end portion of the media sheet 4 has been taken up by the take-up shaft 7 at the time of loading of the media sheet 4, a predetermined amount of the media sheet 4 is further taken up by the take-up shaft 7 in a state where the pressing force of the pressure rollers 16a and 16b is cancelled. Thus, the media sheet 4 can be taken up by the take-up shaft 7 without being affected by mounting error of the take-up shaft 7 relative to the pressure rollers 16a and 16b.

Meanwhile, in the case where the pressing force of the pressure rollers 16a and 16b is recovered, the media sheet 4 disposed adjacent to the pressure rollers 16a and 16b is subjected to exposure in advance by the non-image forming exposure lamp 5 such that the microcapsules are set. Therefore, when the pressing force of the pressure rollers 16a and 16b has been recovered, the microcapsules are not ruptured on the media sheet 4, so that contamination of the pressure rollers 16a and 16b due to ooze of the colorless dye from the microcapsules does not occur.

In accordance with the present invention, since the media sheet can be taken up by the take-up shaft without being affected by mounting error between the take-up shaft and the pressure rollers, oblique feed of the media sheet can be positively prevented.

Furthermore, in accordance with the present invention, the pressing force of the pressure rollers is recovered in a state where the microcapsules of the media sheet have been set sufficiently. Accordingly, at the time of recovery of the pressing force of the pressure rollers, the microcapsules are not ruptured and thus, contamination of the pressure rollers due to rupture of the microcapsules can be alleviated.

Figure 6:
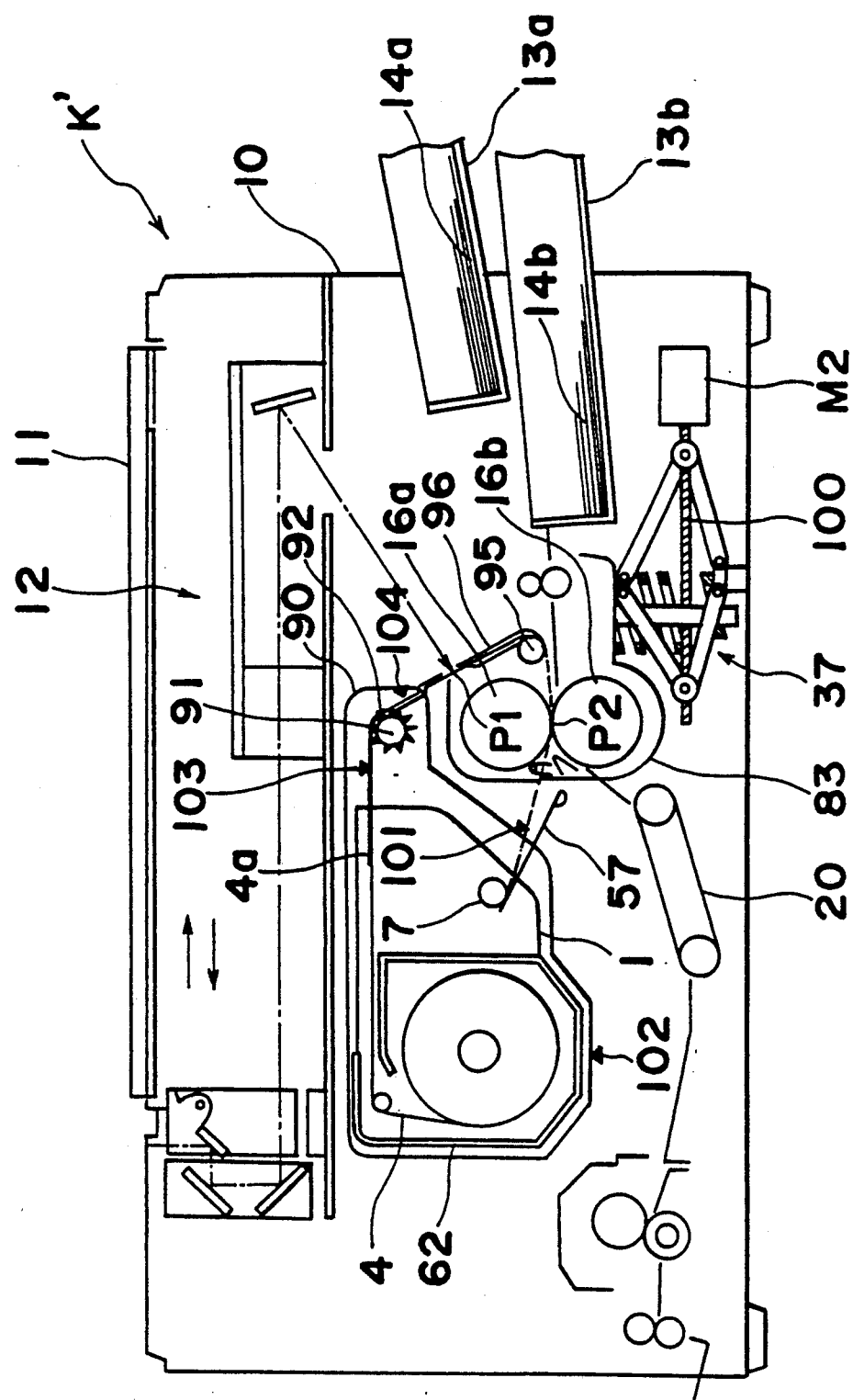
FIG. 6 is view similar to FIG. 1, particularly showing a modification thereof.

FIGS. 6 to 10 show an image forming apparatus K, which is a modification of the apparatus K. The apparatus K' is arranged such that the high pressing force is not applied to a joint 98 (FIG. 8) between the leader portion 4a and the media sheet 4 at the time of automatic loading of the leader portion 4a. In FIG. 6, the lift mechanism 37 is secured to a frame 83 of the lower pressure roller 16b. The lift mechanism 37 is arranged to be disposed upwardly and downwardly in accordance with an amount of rotation of a worm screw shaft 100 so as to bring the upper and lower pressure rollers 16a and 16b into and out of pressing contact with each other. The motor M2 is formed by a DC motor incorporating a speed reduction mechanism and is mounted on a distal end of the worm screw shaft 100. Rotation of the motor M2 is controlled by signals.

A carriage 90 is provided at a slightly left side of the apparatus housing 10. The cartridge 1 accommodating the media sheet 4 is mounted in the carriage 90 by pulling the carriage 90 out of the apparatus housing 10. The transport passage of the media sheet 4 extends to the upper and lower pressure rollers 16a and 16b from an outlet for the media sheet 4, which is provided in a housing 62 of the cartridge 1. A pair of sprockets 92 are provided at opposite end portions of a transport roller 91 such that teeth of the sprockets 92 are fitted into the sprocket holes 93 (FIG. 8) formed at the opposite side portions of the leader portion 4a. A transport plate 96 is disposed between the transport roller 91 and a transport roller 95 and an opening is formed at a substantially central portion of the transport plate 96 such that reflected light from the original document is exposed on the media sheet at the exposure position P1 through the opening of the transport plate 96. The media sheet 4 having a selectively set image formed thereon through exposure is guided in between the upper and lower pressure rollers 16a and 16b.

The media sheet 4 pressed between the upper and lower pressure rollers 16a and 16b at the pressing position P2 is taken up by the take-up shaft 7 of the cartridge 1 along a guide plate 57. In the course of the transport passage of the media sheet 4, microswitches 103 and 104 are, respectively, provided upstream and downstream of the sprockets 92 so as to detect a state of setting of the teeth of the sprockets 92 in the sprocket holes 93. A microswitch 101 for detecting completion of loading of the media sheet 4 on the take-up shaft 7 is provided downstream of the upper pressure roller 16a. Meanwhile, a microswitch 102 for detecting a state of mounting of the cartridge 1 in the apparatus housing 10 is promised at a position corresponding to a bottom of the housing 62 of the cartridge 1. Actuators of the microswitches 103 and 104 are so provided as to project slightly into the transport passage of the media sheet 4. Thus, when the leader portion 4a of the media sheet 4 is preset in the transport passage, the leader portion 4a is brought into contact with the actuators of the microswitches 103 and 104 so as to displace the actuators of the microswitches 103 and 104 such that the microswitches 103 and 104 are turned on. Therefore, when the sprocket holes 93 of the leader portion 4a receive the teeth of the sprockets 93 properly, the microswitch 103 is turned on. Meanwhile, when transport of the media sheet 4 is started, the microswitch 104 is turned on.

Meanwhile, at the time when the leader portion 4a has reached the take-up shaft 7, the leader portion 4a is transported along the guide plate 57. Subsequently, when the leader portion 4a has been taken up by the take-up shaft 7, the leader portion 4a is strained straight At this time, the strained leader portion 4a is brought into contact with an actuator of the microswitch 101 so as to displace the actuator of the microswitch 101 such that the microswitch 101 is turned on. Accordingly, the microswitch 101 detects that the leader portion 4a has been properly wound around the take-up shaft 7. At this time, the joint 98 between the leader portion 4a and the media sheet 4 is disposed upstream of the pressure rollers 16a and 16b.

When the microswitch 101 has detected completion of automatic loading of the leader portion 4a as described above, the motor M2 of the lift mechanism 37 is rotated clockwise so as to control the pressing force of the pressure rollers 16a and 16b such that the leader portion 4a and the joint 98 between the leader portion 4a and the media sheet 4 are passed between the pressure rollers 16a and 16b held out of contact with each other. After the joint 98 has passed between the pressure rollers 16a and 16b, the motor M2 is rotated counterclockwise so as to bring the pressure rollers 16a and 16b into pressing contact with each other.

Figure 8:
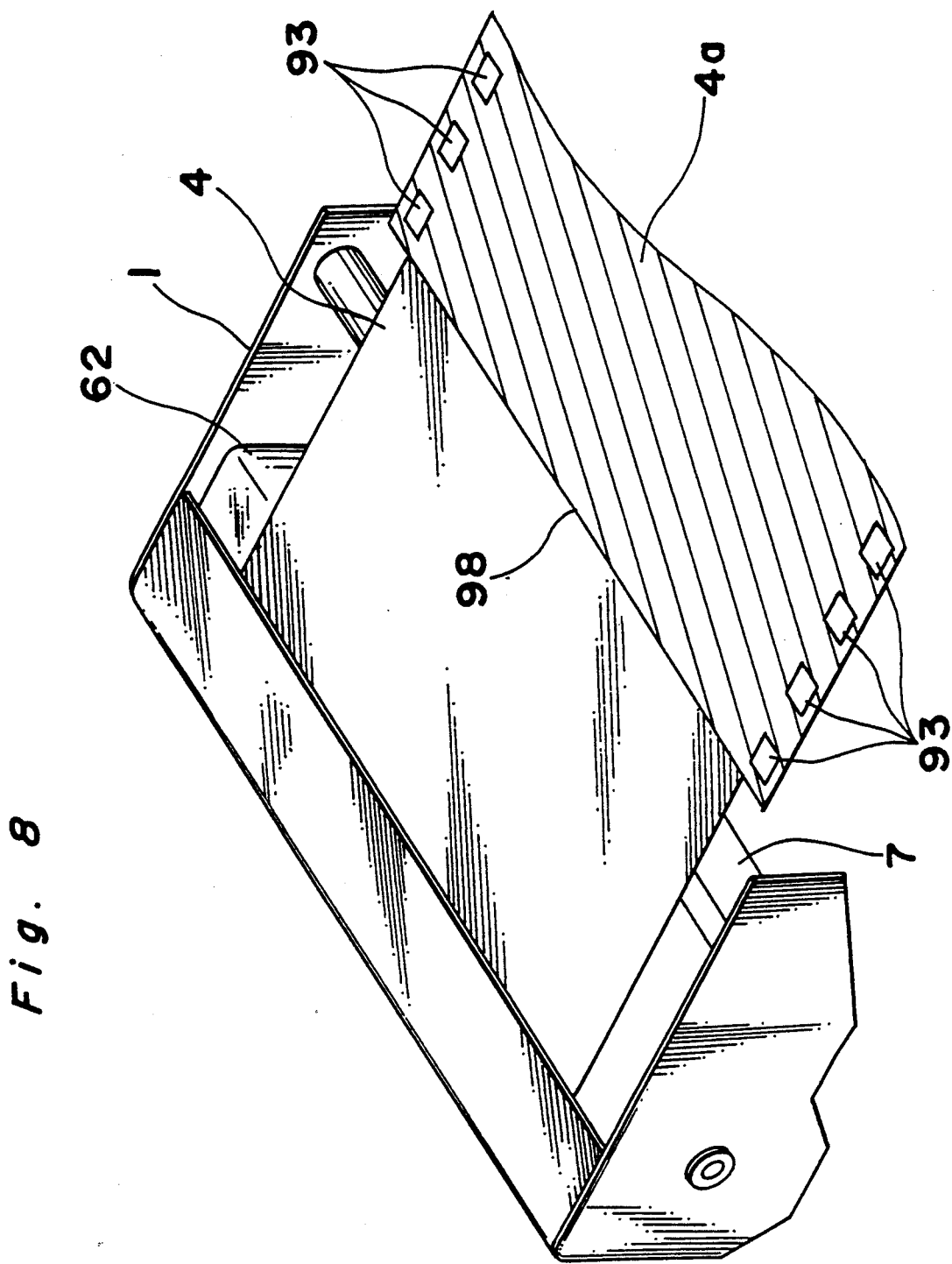
FIG. 8 is a perspective view of the media sheet drawn from a cartridge employed in the apparatus of FIG. 6.

FIG. 8 shows a state in which the media sheet 4 and the leader portion 4a provided at the distal end of the media sheet 4 have been drawn out of the cartridge 1. The media sheet 4 to the distal end of which the leader potion 4a is attached by fusion bonding, is drawn out of the housing 62. If the high load is applied to the joint 98 at the pressing position P2 by the pressure rollers 16a and 16b, a force is exerted so as to detach the media sheet 4 and the leader portion 4a and thus, the leader portion 4a is detached from the distal end of the media sheet 4. The leader potion 4a is wider than the media sheet 4 so as to laterally extend beyond the media sheet 4 such that overhang portions are formed at opposite sides of the leader sheet 4a relative to the media sheet 4. The sprocket holes 93 are formed at the overhang portions of the leader portion 4a. At the time of loading of the media sheet 4, the teeth of the sprockets 92 provided at the opposite end portions of the transport roller 91 are fitted into the sprocket holes 93. Subsequently, the media sheet 4 is transported along the transport plate 96, the transport roller 95, the upper and lower pressure rollers 16a and 16b and the guide plate 57 so as to be taken up by the take-up shaft 7 as shown in FIG. 6.

Figure 7:
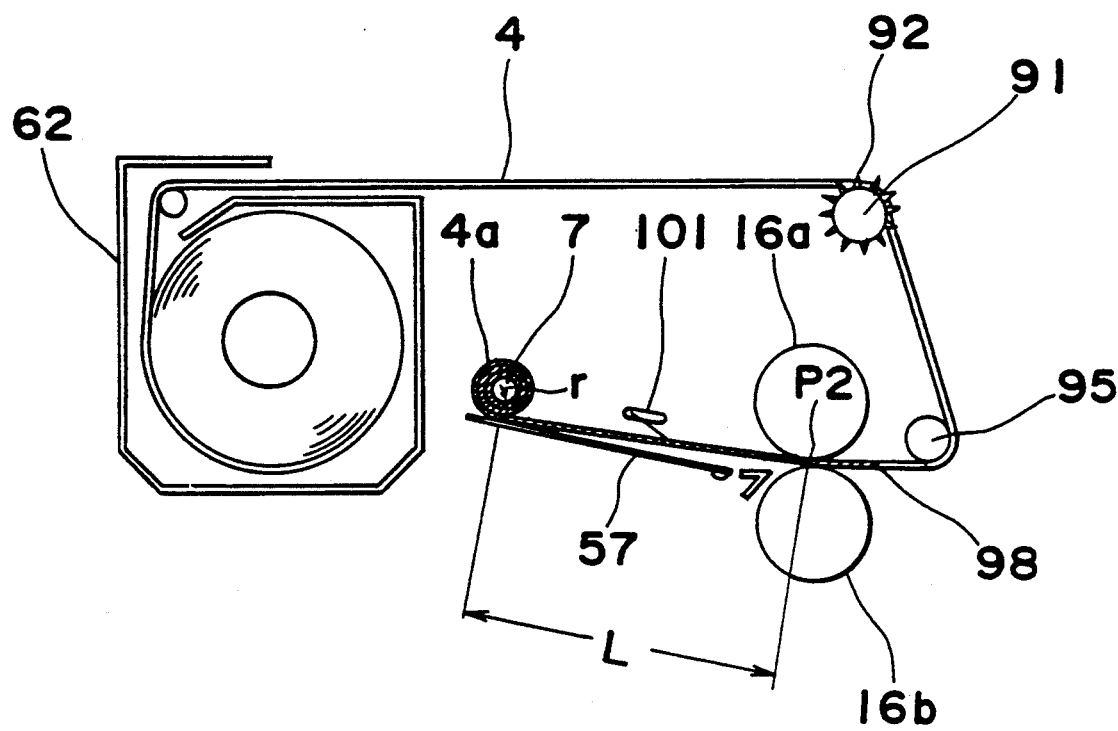
FIG. 7 is a view showing the media sheet in the apparatus of FIG. 6.

FIG. 7 shows a necessary length of the leader portion 4a fusion bonded to the distal end of the media sheet 4 of the cartridge 1. After the teeth of the sprockets 92 provided at the opposite ends of the transport roller 91 have been fitted into the sprocket holes 93 of the leader portion 4a drawn from the outlet of housing 62 of the cartridge 1, automatic loading of the leader portion 4a is performed. When a distal end of the leader portion 4a has passed between the pressure rollers 16a and 16b so as to reach the take-up shaft 7 along the guide plate 57, the distal end of the leader portion 4a is bonded to an adhesive portion of the take-up shaft 7. At this time, the leader portion 4a is still being transported on the guide plate 57 and has not yet been taken up by the take-up shaft 7 one turn. Thus, if the pressing force of the pressure rollers 16a and 16b is cancelled, the leader portion 4a is readily disengaged from the take-up shaft 7. When automatic loading of the leader portion 4a is further continued, the leader potion 4a is taken up by the take-up shaft 7 several turns, so that the leader potion 4a is strained straight from the pressing position P2 of the pressure rollers 16a and 16b to the take-up shaft 7. Therefore, the leader portion 4a is brought into contact with the actuator of the microswitch 101 so as to displace the actuator of the microswitch 101 such that the microswitch 101 is turned on. At this time, the leader portion 4a has been taken up by the take-up shaft 7 several turns as described above. Hence, even if the pressing force of the pressure rollers 16a and 16b is cancelled, the leader portion 4a is securely fitted around the take-up shaft 7 without being disengaged from the take-up shaft 7 and thus, automatic loading of the leader portion 4a on the take-up shaft 7 has been completed. At this time, the joint 98 between the leader portion 4a and the media sheet 4 is disposed upstream of the pressing position P2 of the pressure rollers 16a and 16b. Supposing that character L denotes a distance from the pressing position P2 of the pressure rollers 16a and 16b to the take-up shaft 7 and character r denotes a radius of the take-up shaft 7, the leader portion 4a is required to have a length of $(L+3\times 2\pi r)$ approximately.

Figure 9:
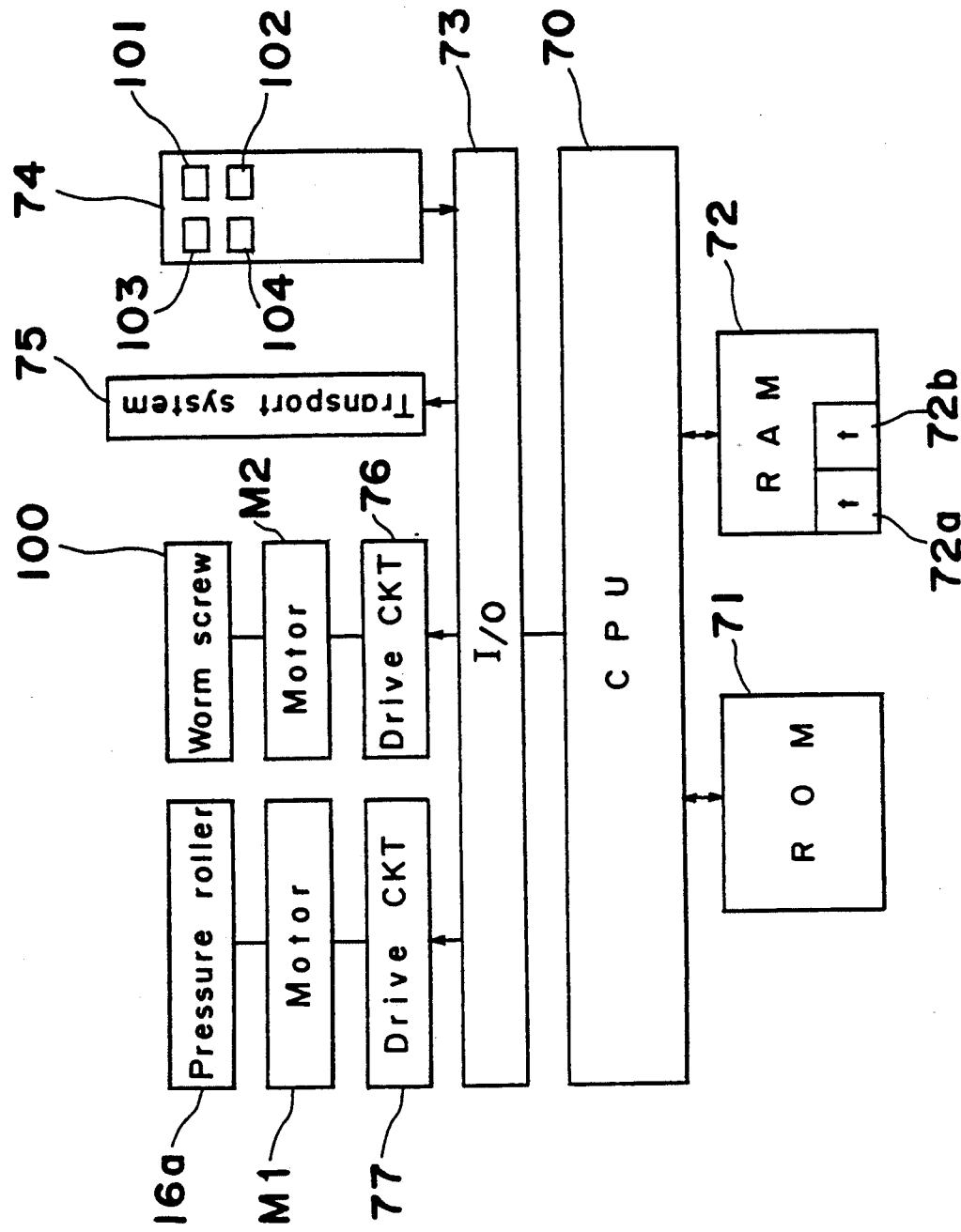
FIG. 9 is a block diagram showing a part of a control portion of the apparatus of FIG. 6.

FIG. 9 shows a part of a control portion of the apparatus K'. The control portion includes a CPU 70. A ROM 71 for storing programs, a RAM 72 used for a timer 72a, a working area, etc. and an I/O interface 73 are connected to the CPU 70. A sensor group 74 including the microswitches 101 to 104, a transport system 75 for feeding the image reserving sheets 14a and 14b from the cassettes 13a and 13b and for driving the transport belt 20, a drive circuit 76 for driving the motor M2 coupled with the worm screw shaft 100 and a drive circuit 77 for driving the main motor M1 coupled with the upper pressure roller 16a are connected to the I/O interface 73.

Figure 10A:
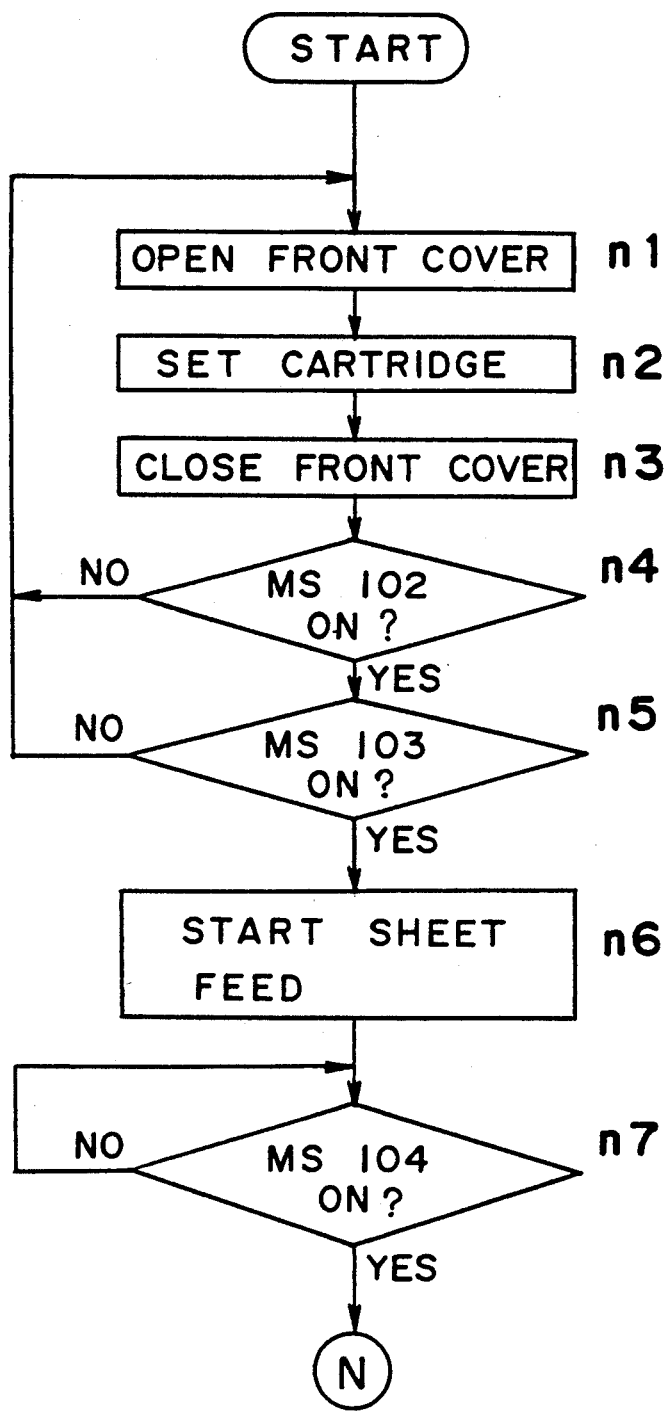
FIGS. 10a and 10b are flow charts showing processing sequences of automatic loading of the media sheet in the apparatus of FIG. 6.
Figure 10B:
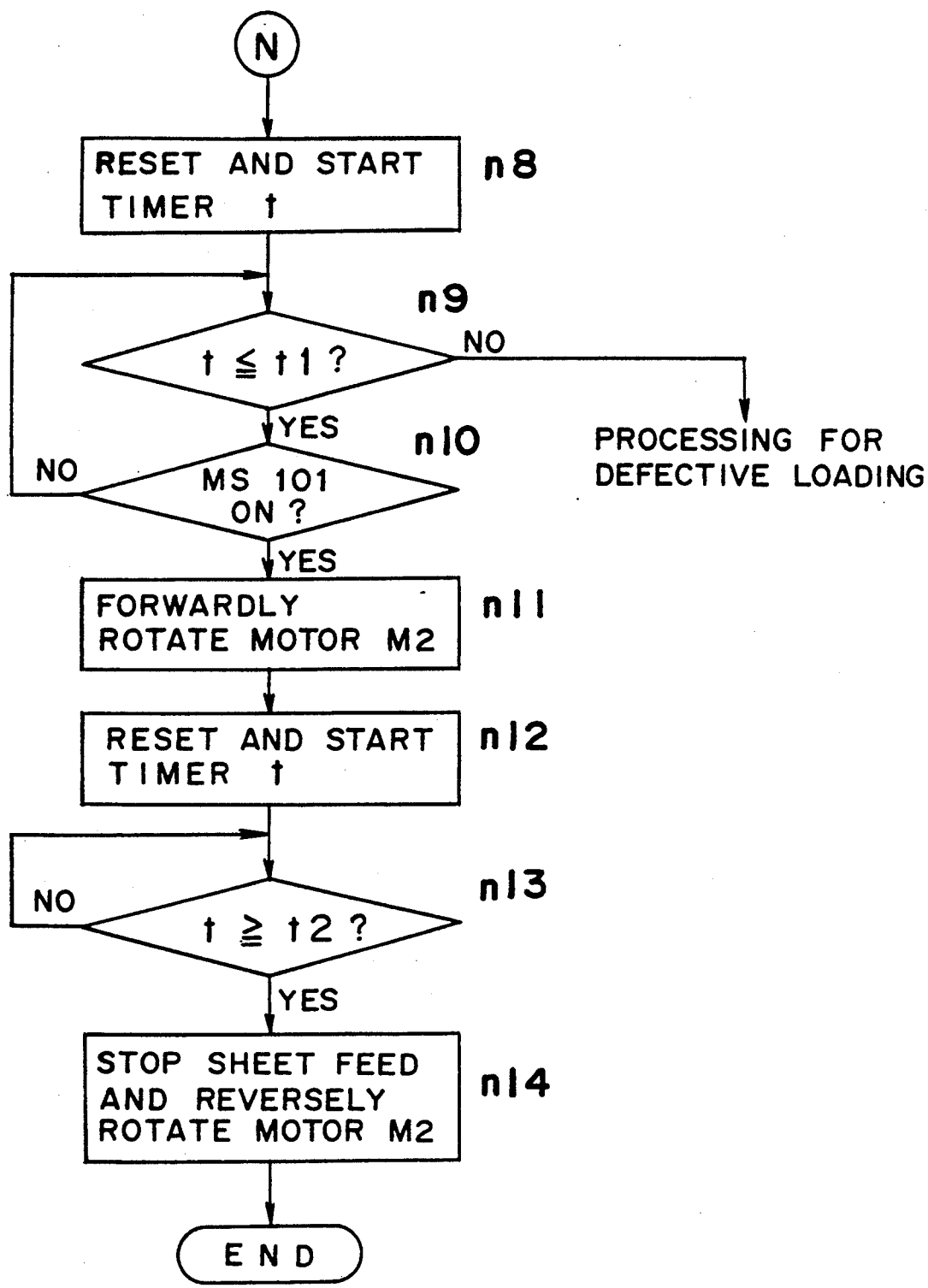

FIGS. 10a and 10b show processing sequences o automatic loading of the leader portion 4a on the take-up shaft 7 in the apparatus K'. Initially, a front cover (not shown) of the apparatus housing 10 is opened at step n1. Then, at step n2, the carriage 90 is drawn out of the apparatus housing 10, the cartridge 1 is mounted in the cartridge 90 from above, the teeth of the sprockets 92 are fitted into the sprocket holes 93 and then, the carriage 90 is returned into the apparatus housing 10. At step n3, the front cover is closed. If the cartridge 1 is properly set in the carriage 90, the microswitch 102 is turned on at step n4. Furthermore, if the media sheet 4 is properly engaged with the sprockets 92, the microswitch 103 is turned on at step n4. If either one of the microswitches 102 and 103 is not turned on, the program flow returns to step n1.

On the other hand, if both of the microswitches 102 and 103 are turned on, feed of the media sheet 4 is started at step n6. When the media sheet 4 is properly fed, the microswitch 104 provided downstream of the sprockets 92 is turned on at step n7 by detecting the front end of the media sheet 4. Then, at step n8, a timer t is reset so as to start time counting. A fact that the microswitch 101 is not turned on after lapse of a predetermined period t1 means that the leader portion 4a is not taken up by the take-up shaft 7. Thus, in this case, a processing for defective loading of the media sheet 4 is performed. If the microswitch 101 is turned on within the predetermined period t1 at step n10, the leader portion 4a has been positively taken up by the take-up shaft 7, thereby resulting in completion of automatic loading of the media sheet 4. Hence, in this case, the motor M2 of the lift mechanism 37 is forwardly rotated at step n11 so as to cancel the pressing force of the pressure rollers 16a and 16b. Then, at step n12, the timer t is reset so as to start time counting. When a predetermined period t2 has elapsed at step n13, the joint 98 between the leader portion 4a and the media sheet 4 passes through the pressure rollers 16a and 16b, so that at step n14, feed of the media sheet 4 is stopped and the motor M2 is reversely rotated so as to bring the pressure rollers 16a and 16b into pressing contact with each other such that depression of a print switch (not shown) is awaited.

Meanwhile, the predetermined period t1 is a period from a time point at which the front end of the media sheet 4 turns on the microswitch 104 to a time point at which the media sheet strained straight through take-up of the media sheet by the take-up shaft 7 turns on the microswitch 101. The predetermined period t2 is a period from a time point of completion of loading of the leader portion to a time point at which the joint 98 disposed upstream of the pressure rollers 16a and 16b passes through the pressure rollers 16a and 16b. In the above described arrangement, steps n10 to n14 constitute a cancellation means for cancelling the pressing force of the pressure rollers 16a and 16b until the joint 98 passes through the pressure rollers 16a and 16b after the microswitch 101 has detected completion of automatic loading of the leader portion 4a.

In the apparatus K', cancellation of the pressing force of the pressure rollers 16a and 16b is performed by the lift mechanism 37 but can be performed by another method.

In the apparatus K', length of the leader portion of the media sheet of the cartridge mounted in the apparatus housing is set such that automatic loading of the media sheet is completed a short time before the joint between the leader portion and the media sheet passes through the pressing position of the pressure rollers. Therefore, when the front end of the leader portion has been positively taken up by the take-up shaft several turns so as not to be disengaged from the take-up shaft even if the pressing force of the pressure rollers is not applied to the leader portion, the joint between the leader portion and the media sheet is disposed upstream of the pressure rollers. In this state, the pressing force of the pressure rollers is cancelled and the joint disposed upstream of the pressure rollers is passed through the pressure rollers to the downstream side of the pressure rollers. Then, the pressure rollers are again brought into pressing contact with each other. Therefore, since the high pressing force of the pressure rollers is not applied to the joint, the leader portion is not detached from the media sheet at the joint.

Accordingly, in the apparatus K', automatic loading of the leader portion is performed positively and the leader portion is not detached from the media sheet at the joint subsequently, so that such a problem is alleviated that loading of the leader portion can be performed but loading of the media sheet cannot be performed. Consequently, such a waste as discarding of the unused media sheet can be eliminated, thereby resulting in improvement of operational efficiency of the apparatus and economy of the media sheet.

Figure 11:
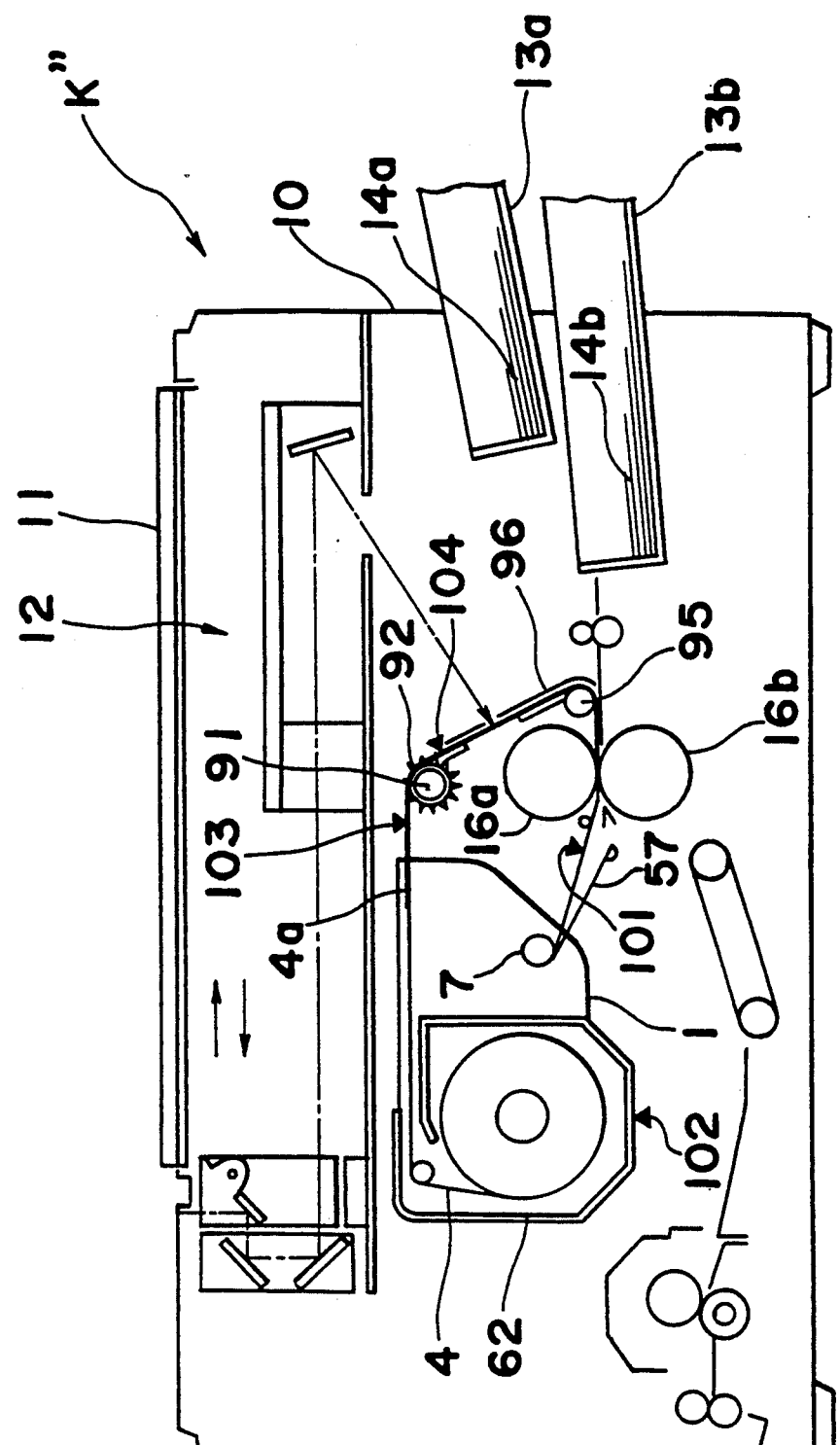
FIG. 11 is a view similar to FIG. 1, particularly showing a further modification thereof.
Figure 12A:
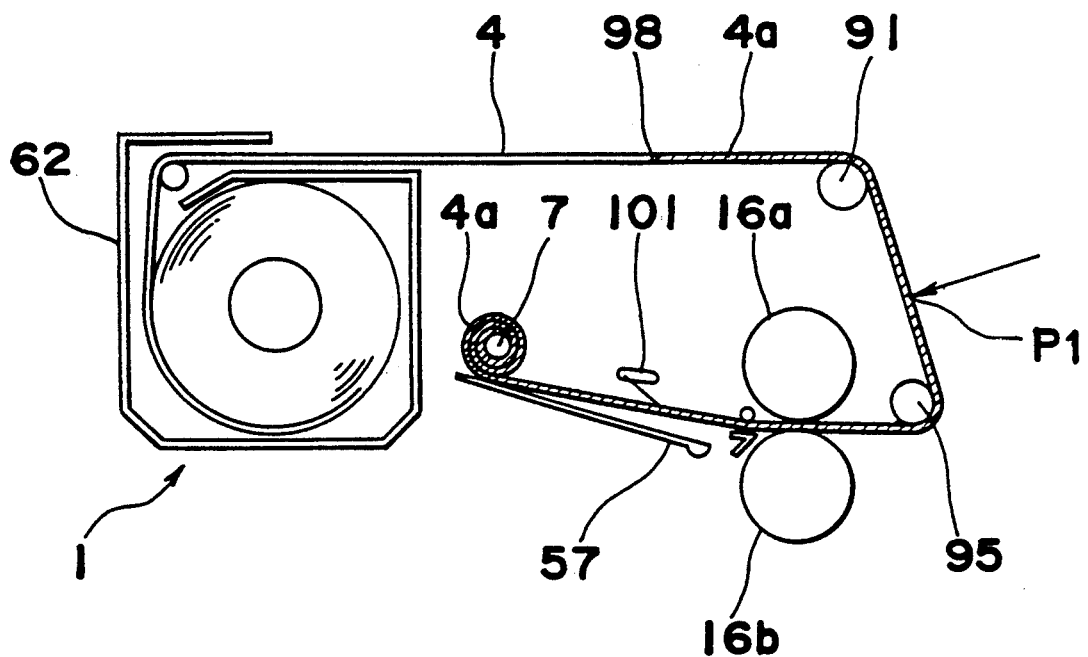
FIGS. 12a and 12b are schematic views showing a cartridge and pressure rollers employed in the apparatus of FIG. 11.
Figure 12B:
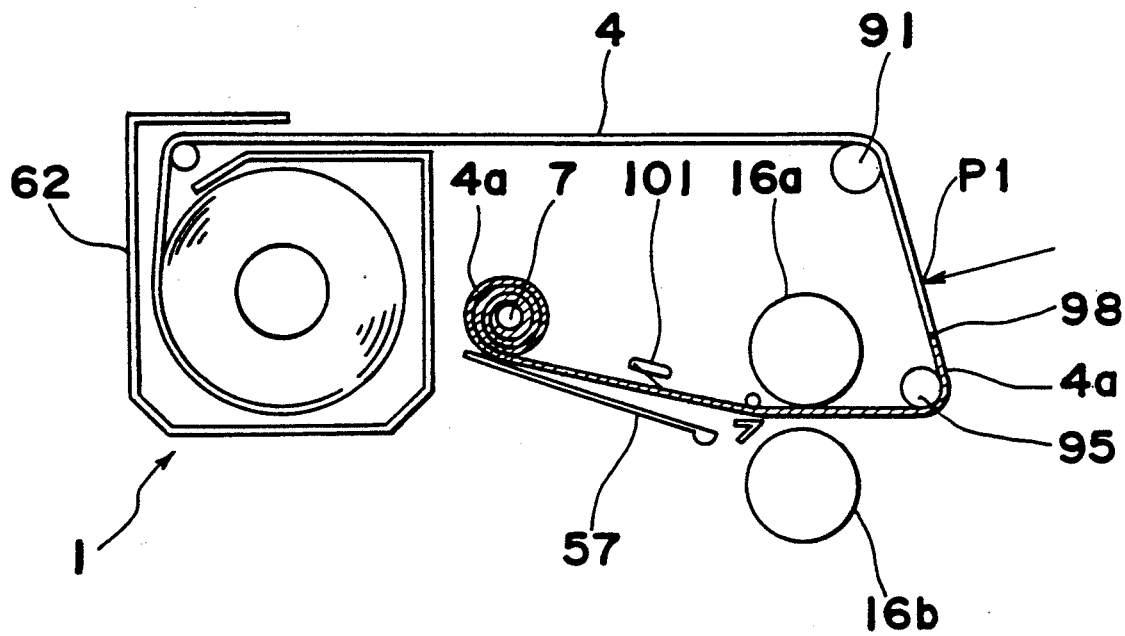
Figure 13:
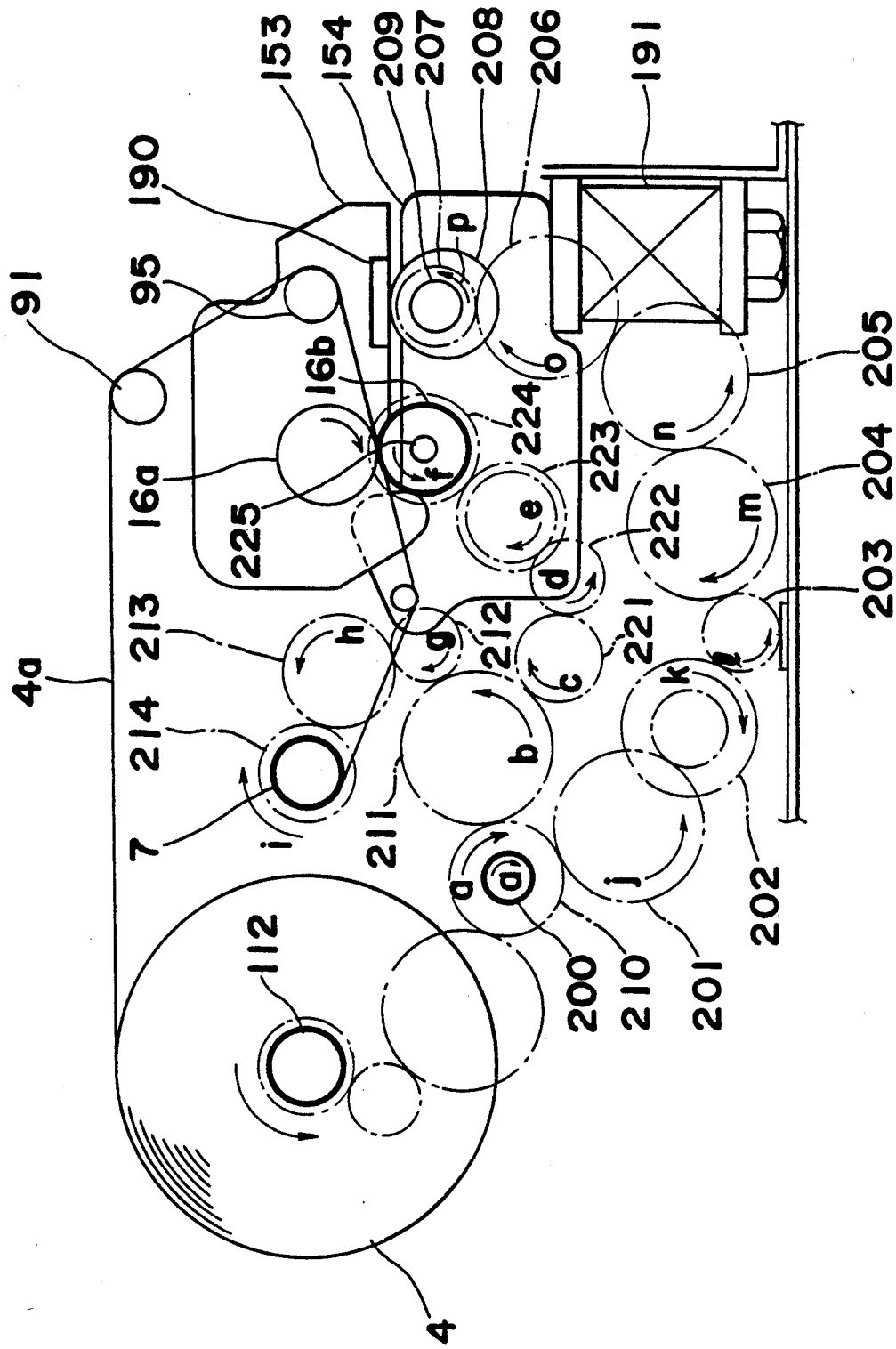
FIG. 13 is a view showing a main portion of drive gears of the apparatus of FIG. 11.

FIGS. 11 to 15 show an image forming apparatus K" which is a further modification of the apparatus K. The apparatus K" is arranged such that an initial defective loading phenomenon in automatic loading of the leader portion 4a of the media sheet 4 can be eliminated easily. As shown in FIG. 13, a spring 191 upwardly urges a frame 154 for the lower pressure roller 16b so as to press the lower pressure roller 16b against the upper pressure roller 16a. The media sheet 4 is wound around a supply shaft 112 of the cartridge 1 so as to be accommodated in the housing 62. As shown in FIG. 11, the apparatus K" includes the microswitches 101 to 104 as in the apparatus K'. Since other main arrangements of the apparatus K" of FIG. 11 are similar to those of the apparatus K' of FIG. 6, detailed description thereof is abbreviated hereinafter.

FIG. 13 shows a main portion of drive gears of the apparatus K". The leader portion 4a provided at the distal end of the media sheet 4 wound around the supply shaft 112 is taken up by the take-up shaft 7 through the transport rollers 91 and 95 and the pressure rollers 16a and 16b. At this time, power transmission among the drive gears is performed as follows. A shaft 200 is coupled with the main motor M1 and rotation of the main motor M1 is transmitted to a shaft 225 of the lower pressure roller 16b via a gear 210, a clutch 211 and gears 221 to 224. The clutch 211 is an electromagnetic clutch which is engaged with the gear 210 upon its turning or through application of a voltage thereto so as to transmit rotation of the main motor M1 to the shaft 225. The shaft 200 is rotated in the direction of the arrow a by the main motor M1. Thus, rotation of the main motor M1 is transmitted from the gear 210 to the shaft 225 in the directions of the arrows a through f. Meanwhile, rotation of the main motor M1 is also transmitted from the gear 210 to the take-up shaft 7 through the clutch 211 and gears 212 to 214 in the directions of the arrows a, b and g through i.

Hereinbelow, operation of the apparatus K" at the time of cancellation of the pressing force of the pressure rollers 16a and 16b is described. Rotation of the shaft 200 coupled with the main motor M1 is transmitted to a shaft 209 via the gear 210, a clutch 201 for cancelling the pressing force of the pressure rollers 16a and 16b and gears 202 to 207 so as to rotate a cam 208. A cam follower 190 is brought into contact with the cam 208. The cam follower 190 is provided between a frame 153 for the upper pressure roller 16a and the frame 154 for the lower pressure roller 16b and is secured to the frame 153. When the clutch 201 for cancelling the pressing force of the pressure rollers 16a and 16b is turned on upon application of a voltage thereto, the clutch 201 is engaged with the gear 210 so as to transmit rotation of the main motor M1 to the shaft 209 through the gears 202 to 207 in the directions of the arrows a and j through p. Rotation of the gear 207 is transmitted through the cam 208 mounted on the shaft 209 in common with the gear 207. Thus, when a large diameter portion of the cam 208 is brought into contact with the cam follower 190 upon rotation of the cam 208, the frame 154 for the lower pressure roller 16b is displaced downwardly against an elastic force of the spring 191 and thus, the pressing force of the pressure rollers 16a and 16b is cancelled. In this state, the clutch 201 for cancelling the pressing force of the pressure rollers 16a and 16b is de-energized so as to maintain a state of cancellation of the pressing force of the pressure rollers 16a and 16b. Then, the clutch 211 is turned on, so that the take-up shaft 7 is rotated such that a predetermined amount of the leader portion 4a is taken up by the take-up shaft 7. If an initial defective loading phenomenon is found, loading of the leader portion 4a is cancelled.

FIGS. 12a and 12b show the cartridge 1 and the pressure rollers 16a and 16b in the apparatus K". The leader portion 4a drawn from the outlet of the housing 62 of the cartridge 1 is transported by the transport roller 91, the transport plate 96 and the transport roller 95 so as to be guided between the pressure rollers 16a and 16b and is taken up by the take-up shaft 7 along the guide plate 57. In FIG. 12a, the leader portion 4a is wound around the take-up shaft 7 several turns and is strained straight so as to be spaced away from the guide plate 57 such that the microswitch 101 is turned on, thereby resulting in completion of loading the leader portion 4a. In this state, the joint 98 between the leader portion 4a and the media sheet 4 has not yet reached the exposure position P1. At this time, the pressing force of the pressure rollers 16a and 16b is cancelled such that take-up of the leader portion 4a by the take-up shaft 7 is continued.

FIG. 12b shows a state in which after completion of loading of the leader portion 4a, the leader portion 4a has been further taken up by the take-up shaft 7 for a longer one of a first period required for allowing disappearance of slight wrinkling or oblique feed of the leader portion 4a of itself at an initial stage of loading of the leader portion 4a and a second period required for the media sheet 4 to reach the exposure position P1. Thus, the initial defective loading phenomenon is eliminated and transport of the media sheet 4 is stopped when the joint 98 between the leader portion 4a and the media sheet 4 has passed through the exposure position P1.

Figure 15:
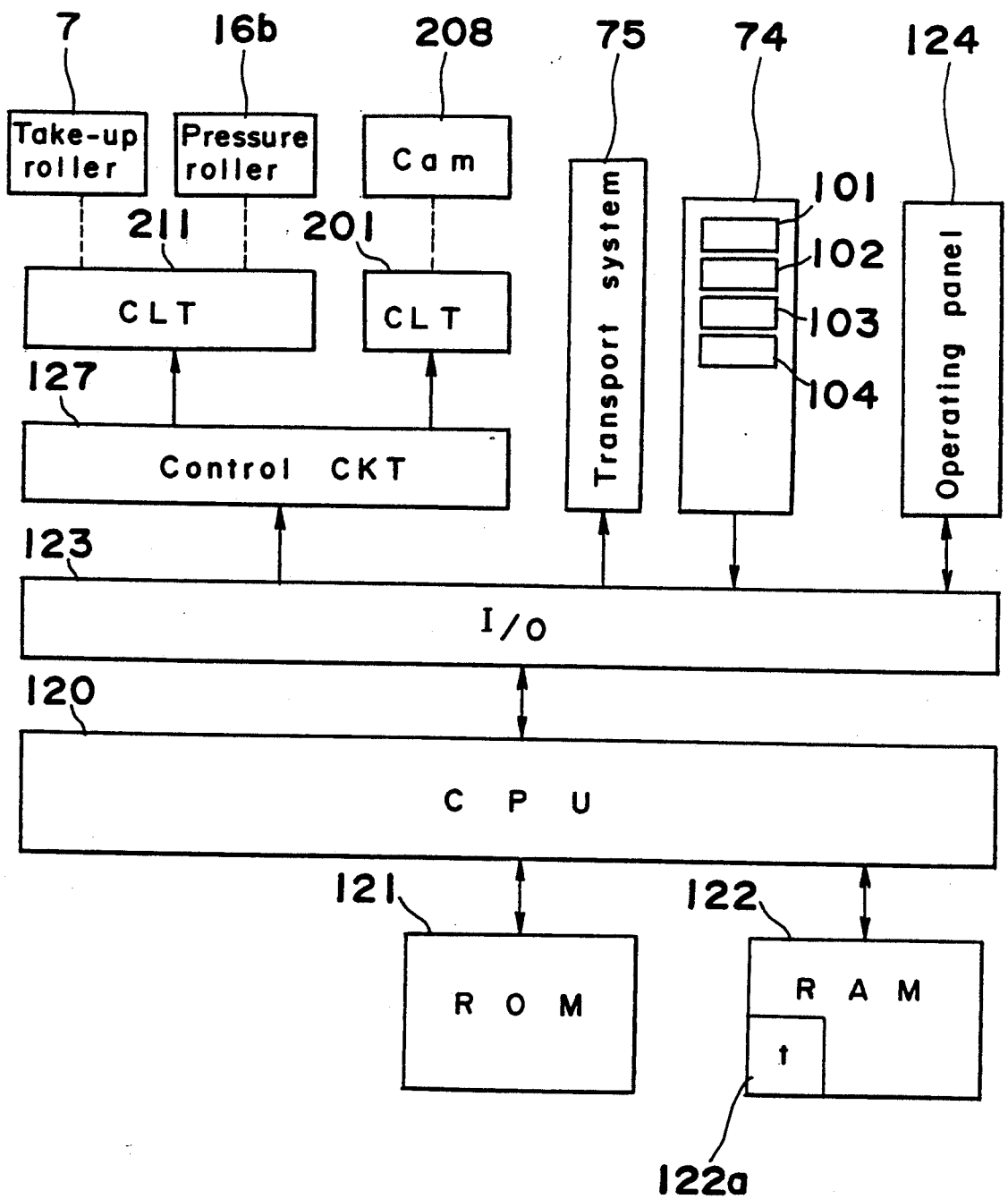
FIG. 15 is a block diagram showing a part of a control portion of the apparatus of FIG. 11

FIG. 15 shows a part of a control portion of the apparatus K". The control portion includes a CPU 120. A ROM 121 for storing programs, a RAM 122 used for a timer 122a, a working area, etc. and an I/O interface 123 are connected to the CPU 120. An operating panel 124 is provided having a display panel (not shown) and operating switches (not shown), the sensor group 74 including the microswitches 101 through 104, the transport system 75 for the image receiving sheets 14a and 14b and a control circuit 127 are connected to the I/O interface 123. The control circuit 127 controls not only the clutch 201 for transmitting rotation of the main motor M1 to the cam 208 but the clutch 211 for transmitting rotation of the main motor M1 to the take-up shaft 7 and the lower pressure roller 16b.

Figure 14A:
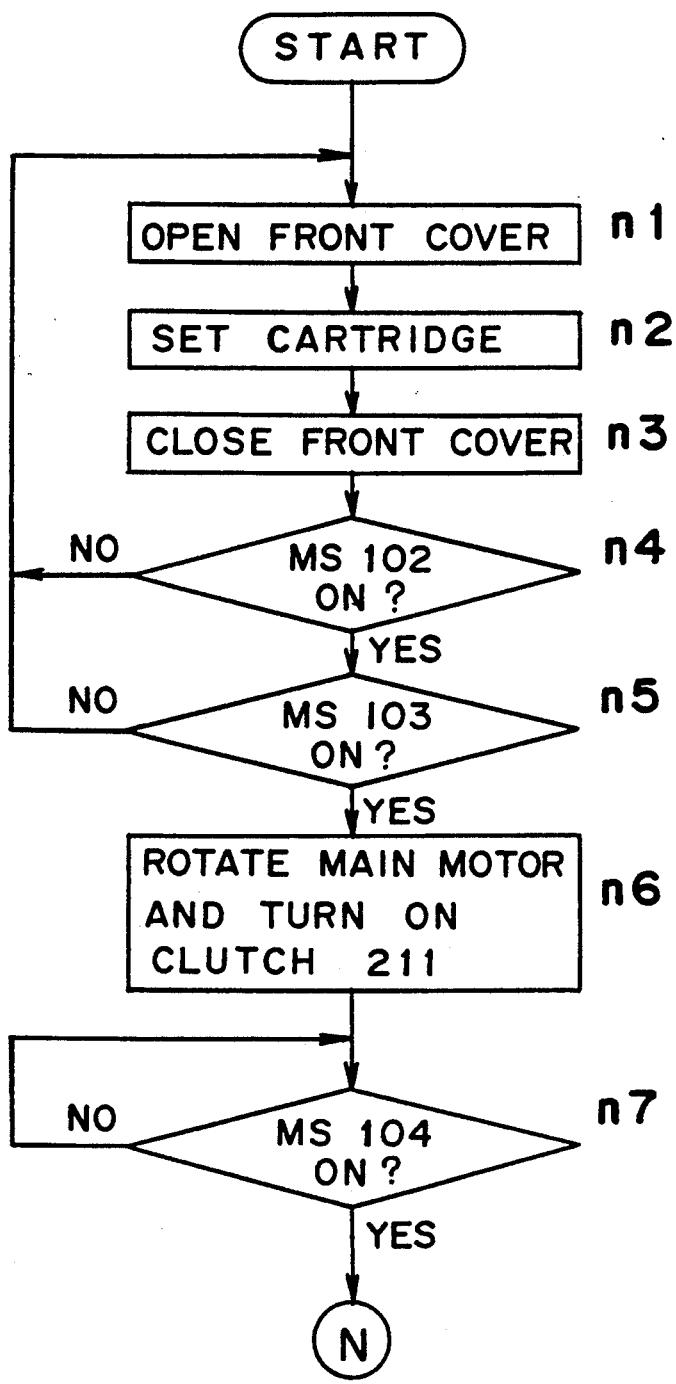
FIGS. 14a and 14b are flow charts showing processing sequences of automatic loading of the media sheet in the apparatus of FIG. 11.
Figure 14B:
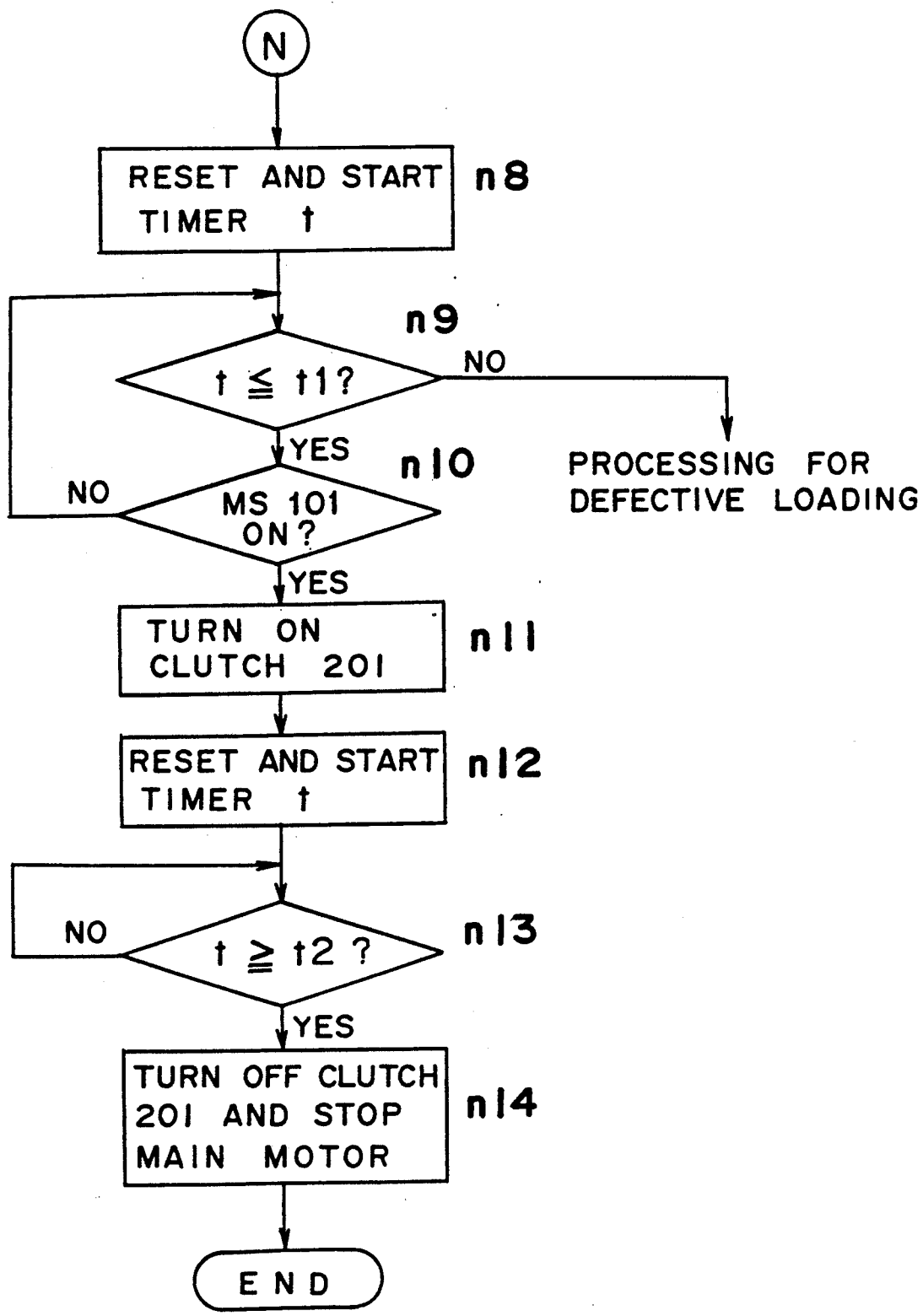

FIGS. 14a and 14b show processing sequences of automatic loading of the media sheet 4 in the apparatus K". At step n6, the main motor M1 is rotated and the clutch 211 is turned on so as to start feed of the media sheet 4. At step n11, the clutch 201 for cancelling the pressing force of the pressure rollers 16a and 16b is turned on so as to cancel the pressing force of the pressure rollers 16a and 16b. In this state, take-up of the leader portion 4a by the take-up shaft 7 is continued. At step n14, the clutch 201 for cancelling the pressing force of the pressure rollers 16a and 16b is turned off so as to press the pressure rollers 16a and 16b against each other and the main motor M1 is stopped. Through take-up of the leader portion 4a by the take-up shaft 7 in a state of cancellation of the pressing force of the pressure rollers 16a and 16b for the predetermined period t2, a minor initial defective loading phenomenon can be eliminated. The predetermined period t2 is a longer one of a period necessary for allowing disappearance of the initial defective loading phenomenon and a period required for the joint 98 to pass through the exposure position P1. Since other steps of the processing sequences of FIGS. 14a and 14b are substantially the same as those of FIGS. 10a and 10b of the apparatus K', description thereof is abbreviated hereinafter.

In the above described arrangement, steps n10 to n14 constitute a transport means for continuing transport of the media sheet 4 for the predetermined period after completion of loading of the leader portion 4a.

In the apparatus K", when loading of the leader portion of the media sheet has been completed, the pressing force of the pressure rollers is cancelled such that feed of the media sheet is continued in a state where the pressing force of the pressure rollers 16a and 16b is cancelled. Thus, the initial defective loading phenomenon such as slight wrinkling or oblique feed of the media sheet is eliminated. Accordingly, take-up of the media sheet is performed properly and defective feed of the media sheet such as wrinkling or oblique feed of the media sheet due to improper tension of the media sheet in the vicinity of the pressure rollers is alleviated. Since defective feed of the media sheet does not take place as described above, the cartridge containing the unused media sheet is required to be discarded undesirably. Furthermore, the apparatus is operated properly, thereby resulting in improvement of operational efficiency and economy of the apparatus.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of loading a media sheet, in which after a rolled media sheet coated with photo-setting microcapsules has been mounted on a supply portion, a front end portion of the media sheet is taken up by a take-up shaft from the supply portion through a pair of pressure rollers, comprising the steps of:

taking up the front end portion of the media sheet by the take-up shaft;

cancelling a pressing force of the pressure rollers such that a predetermined amount of the media sheet is further taken up by the take-up shaft; and recovering the pressing force of the pressure rollers.

2. A method as claimed in claim 1, wherein before the pressing force of the pressure rollers is recovered, the media sheet disposed in the vicinity of the pressure rollers is subjected to exposure for a predetermined period.

3. In an image forming apparatus including an automatic loading mechanism for loading a rolled media sheet having a leader portion attached to its front end and a mechanism for cancelling a pressing force of a pair of pressure rollers, the improvement comprising:

the leader portion having such a length that automatic loading of the leader portion is completed a short time before a joint between the media sheet and the leader portion passes through a pressing position at the pressure rollers;

a detection means for detecting completion of automatic loading of the leader portion; and a cancellation means for cancelling the pressing force of the pressure rollers from a first time point at which the detection means has detected completion of automatic loading of the leader portion to a second time point at which the joint has passed through the pressing position 4. In an image forming apparatus including an automatic loading means for loading a rolled media sheet having a leader portion attached to its front end, a detection means for detecting completion of automatic loading of the leader portion and a cancellation means for cancelling a pressing force of a pair of pressure rollers, the improvement comprising:

the cancellation means cancelling the pressing force of the pressure rollers when the detection means has detected completion of automatic loading of the leader portion; and a transport means for continuing transport of the media sheet for a predetermined period after completion of automatic loading of the leader portion.

* * * * *